US010725066B2

(12) United States Patent
Tao et al.

(10) Patent No.: US 10,725,066 B2
(45) Date of Patent: Jul. 28, 2020

(54) INTERFACE CIRCUIT FOR A CAPACITIVE ACCELEROMETER SENSOR

(71) Applicant: EM Microelectronic-Marin SA, Marin (CH)

(72) Inventors: Yonghong Tao, Singapore (SG); Sylvain Grosjean, Les Fins (FR); Jean-Michel Daga, Aix en Provence (FR)

(73) Assignee: EM Microeletronic-Marin SA, Marin (CH)

( * ) Notice: Subject to any disclaimer, the term of this patent is extended or adjusted under 35 U.S.C. 154(b) by 232 days.

(21) Appl. No.: 16/001,107

(22) Filed: Jun. 6, 2018

(65) Prior Publication Data

US 2018/0364275 A1 Dec. 20, 2018

(30) Foreign Application Priority Data

Jun. 15, 2017 (EP) .................................... 17176258

(51) Int. Cl.

| | |
|---|---|
| ***G01P 15/125*** | (2006.01) |
| ***G01D 5/241*** | (2006.01) |
| ***G01D 5/24*** | (2006.01) |
| ***H03F 3/00*** | (2006.01) |
| ***H03G 3/00*** | (2006.01) |

(52) U.S. Cl.

CPC .............. *G01P 15/125* (2013.01); *G01D 5/24* (2013.01); *G01D 5/241* (2013.01); *H03F 3/005* (2013.01); *H03G 3/008* (2013.01)

(58) Field of Classification Search

CPC ........ G01P 15/125; G01D 5/24; G01D 5/241; H03F 3/005; H03G 3/008

See application file for complete search history.

(56) References Cited

U.S. PATENT DOCUMENTS

| | | | | |
|---|---|---|---|---|
| 5,142,238 | A * | 8/1992 | White | H03F 3/45479 330/9 |
| 5,343,766 | A * | 9/1994 | Lee | G01D 5/2417 73/514.18 |
| 6,909,391 | B2 * | 6/2005 | Rossi | H03F 3/005 341/161 |
| 7,345,530 | B1 * | 3/2008 | Li | H03F 3/005 330/51 |
| 8,198,937 | B1 * | 6/2012 | Vilas Boas | H03F 3/45475 330/258 |
| 8,344,798 | B2 * | 1/2013 | Garrity | H03G 1/0094 327/124 |
| 9,319,033 | B1 * | 4/2016 | Jin | H03K 4/502 |

(Continued)

OTHER PUBLICATIONS

European Search Report dated Nov. 21, 2017 in European Application 17176258.6 filed on Jun. 15, 2017.

*Primary Examiner* — Francis C Gray

(74) *Attorney, Agent, or Firm* — Oblon, McClelland, Maier & Neustadt, L.L.P.

(57) ABSTRACT

The present invention relates to an interface circuit for a capacitive accelerometer sensor for measuring an acceleration value sensed by the sensor. The interface circuit comprises a plurality of electrical switches and three programmable capacitors. Two of the programmable capacitors are arranged to implement gain trimming of the interface circuit, while one of the programmable capacitors is arranged to implement acceleration range selection.

15 Claims, 3 Drawing Sheets

(56) References Cited

U.S. PATENT DOCUMENTS

| | | | | |
|---|---|---|---|---|
| 9,438,262 | B1 * | 9/2016 | Chen | H03M 1/109 |
| 9,461,625 | B1 * | 10/2016 | Prandi | H03H 19/004 |
| 10,234,487 | B2 * | 3/2019 | Nizza | G01R 19/0092 |
| 2007/0120595 | A1 * | 5/2007 | Udupa | H03F 3/45479 330/9 |
| 2010/0231237 | A1 | 9/2010 | Deschildre et al. | |
| 2014/0232464 | A1 * | 8/2014 | Song | H04L 27/01 330/258 |
| 2015/0268284 | A1 | 9/2015 | Opris et al. | |
| 2015/0280668 | A1 | 10/2015 | Huang et al. | |

* cited by examiner

INTERFACE CIRCUIT FOR A CAPACITIVE ACCELEROMETER SENSOR

This application claims priority from European patent application No. 17176258.6 filed on Jun. 15, 2017, the entire disclosure of which is hereby incorporated herein by reference.

TECHNICAL FIELD

The present invention relates to an interface circuit for a capacitive accelerometer sensor for converting charges received from the capacitive accelerometer sensor into a useful signal for a given application. The invention also relates to a method for operating the interface circuit.

BACKGROUND OF THE INVENTION

A capacitive accelerometer is an accelerometer device which measures accelerations (on a surface) using capacitive sensing techniques. It can sense and record acceleration on equipment or devices and converts this acceleration into electrical currents or voltages. Capacitive accelerometers are also sometimes referred to as vibration sensors. They comprise a capacitive micro-electro-mechanical system (MEMS) element operating as a capacitive accelerometer sensor connected to an electronic circuit, referred to also as an interface circuit. When supplied by the electronic circuit, the MEMS element converts the resulting force due to its acceleration into an electrical signal, which in turns is amplified by the electronic circuit, and converted into a useful signal for a given application (for example a digital representation of the acceleration). In capacitive MEMS accelerometers, a change of the MEMS capacitance in presence of the acceleration generates the electrical signal. Capacitive accelerometers are widely implemented in computational and commercial applications, such as airbag deployment sensors in automobiles, human computer interaction devices and smartphones.

The circuits shown in FIGS. 1*a* and 1*b* illustrate one example of a capacitive accelerometer system or device 1, referred to simply as a capacitive accelerometer or accelerometer. The accelerometer comprises a capacitive accelerometer sensor 3 and an analogue frontend interface circuit 5 connected to the capacitive accelerometer sensor 3. The sensor in this example comprises two capacitors, namely a first capacitor C1 with a first capacitance $c_1$ and a second capacitor C2 with a second capacitance $c_2$. The first and second capacitors C1, C2 have one common mobile electrode, which is arranged to be displaced when the sensor 3 is subject to an acceleration or deceleration. This displacement generates a capacitance difference between $c_1$ and $c_2$, which can then be detected by the interface circuit 5.

The operation of the interface circuit can be divided into three main operational phases: an auto-zero (AZ) phase, a charge transfer (XFER) phase and an analogue-to-digital conversion phase. FIG. 1*a* illustrates the circuit configuration during the AZ phase, while FIG. 1*b* illustrates the circuit configuration during the XFER phase. The analogue-to-digital conversion phase may be further divided into two sub-phases, namely an input tracking phase and a successive approximation register (SAR) convergence phase as explained better in connection with FIG. 2. The charges may be collected from the mobile electrode of the capacitive accelerometer sensor 3 by applying two successive phases (i.e. first and second phases defining a charge transfer period or duration) of each of the two voltage polarities, namely the AZ and XFER phases. During the AZ phase, a first amplifier 7 of the interface circuit 5 is reset. A positive input node of the amplifier is connected to a voltage source VCM1, which in this example supplies a voltage referred to as common mode voltage $V_{cm}$, while a negative input node of the first amplifier 7 is connected to the sensor 3. During the XFER phase, the charges are transferred to the first amplifier 7, which transforms these charges to an output voltage value $V_{out}$ at an amplifier output node Aout. As can be seen in FIGS. 1*a* and 1*b*, the first capacitor C1 is connected to a second voltage source 12, while the second capacitor C2 is connected to a third voltage source 13. These two voltage sources 12, 13 may be programmable or they may have the output of supply voltage VDD or VSS. As shown in FIG. 1*a*, during the AZ phase, a switch S11 is closed, and the first capacitor C1 is connected to the second voltage source 12 now supplying a positive supply voltage VDD, while the second capacitor C2 is connected to the third voltage source now set to 0 V, ie the third voltage source 13 is now grounded. As can be seen in FIG. 1*b*, during the XFER phase, the switch S11 is first opened, and the second voltage source 12 is set to 0 V, while the third voltage source 13 now supplies the positive supply voltage VDD. At the end of the XFER phase, the output voltage at the amplifier output node Aout is $$V_{out}=VDD\cdot(c_1-c_2)/c_f,$$

where $c_f$ is the capacitance of a feedback capacitor Cf.

The output voltage value $V_{out}$ at the node Aout can be digitalised by an analogue-to-digital converter (ADC) 9. It is well known that an SAR ADC is a favoured candidate for a low power design with moderate resolution. One single-ended implementation of the ADC 9 based on a charge redistribution method is shown in FIG. 2. During the input tracking phase, switches S12 and S22 are closed, while switches S32 and S42 are open. The switch S32 is connected to a voltage source VDD, which supplies the positive supply voltage VDD, while the switch S42 is connected to a voltage source VSS, which is set to 0 V. The input voltage $V_{in}$ at the node Aout is tracked by a capacitor array Cdac, where $V_{in}=V_{out}$. A second amplifier 11 is used as an amplifier during input-tracking phase. During the SAR convergence phase, the switches S12 and S22 are open, while the switches S32 and S42 are controlled by an SAR algorithm, i.e. a binary searching algorithm. The second amplifier 11 is used as a comparator during this phase only. The positive input node is connected to a voltage source VCM2 for supplying the common mode voltage $V_{cm}$. The input voltage value $V_{in}$ is digitised as follows $$D_{out}=V_{in}/VDD,$$

where $D_{out}$ is a quantised fractional value.

Since VDD is also used as the reference voltage for the ADC 9 in the accelerometer 1, the digitised acceleration can be expressed as $$D_{out}=(c_1-c_2)/c_f,$$

where $D_{out}$ is a quantized fractional number.

For the accelerometer 1, it is also required to be able to tune the gain, which is defined as:

$$\text{Gain}=D_{out}/(c_1-c_2)=1/c_f$$

It is required to make the feedback capacitor Cf programmable to accommodate for $c_1-c_2$ values that are usually in the range of a few fF to a few tens of fF. Furthermore, the feedback capacitor Cf is a small capacitor, for example 80 fF in 2 g mode (one g is the acceleration due to gravity at the Earth's surface). It is difficult to make such a small capacitor programmable and to have a fine grain size of programmability, for example, 1% of 80 fF. Since the feedback capacitor Cf is a floating capacitor, it is hard to manage the impact of the parasitic capacitance of switches used to implement the programmability. In addition, to accommodate a large acceleration input range of for instance 2 g, 4 g, 8 g and 16 g for the accelerometer 1, different programmable values of $c_f$ are required, for example 80 fF in the 2 g range mode, 160 fF in the 4 g range mode, 320 fF in the 8 g range mode and 640 fF in the 16 g range mode. It is very challenging to implement the feedback capacitor Cf to fulfil both programmability requirements for the grain size and range trimming simultaneously.

The patent application US 2015/0268284 A1 describes an apparatus and a method for interfacing an accelerometer (MEMS). The apparatus includes an interface circuit linked to a MEMS capacitor. The interface circuit includes an amplifier integrator connected at input to the MEMS capacitor through a switch. The output of the amplifier is connected to a comparator providing an output signal relative to the charge on capacitor MEMS. It is provided a feedback loop between the output of the comparator and the amplifier integrator, in which a feedback capacitor is provided for tuning also the gain of said apparatus. It is not provided to implement the feedback capacitor to fulfil both programmability requirements for the grain size and range trimming simultaneously, that it is a drawback.

The patent application US 2010/0231237 A1 describes an electronic circuit with a capacitive sensor for measuring a physical parameter. The sensor includes two capacitors mounted in differential, whose a common electrode is connected to one input of a charge transfer amplifier. An integrator is connected to the output of the charge transfer amplifier and is controlled by a dynamic comparator. Nothing is provided to implement a feedback capacitor to fulfil both programmability requirements for the grain size and range trimming simultaneously, that it is a drawback.

The patent application US 2015/0280668 A1 describes a capacitive programmable gain amplifier, but nothing is provided for tuning easily the grain size and range trimming simultaneously, that it is a drawback.

SUMMARY OF THE INVENTION

It is an object of the present invention to overcome the programmability problem of an amplifier feedback capacitor in a capacitive accelerometer sensor interface circuit.

According to a first aspect of the invention, there is provided an interface circuit for a capacitive accelerometer sensor for measuring an acceleration value sensed by the sensor, the interface circuit comprising:

- an amplifier comprising a first input node connected to the sensor, a second input node connected to a first voltage source, and an output node;
- a first amplifier feedback circuit comprising a first switch between the first input node and the output node;
- a second amplifier feedback circuit between the first input node and the output node, and comprising a first programmable capacitor and a second switch in series with the first programmable capacitor, and a third switch connected to a first circuit node between the first programmable capacitor and the second switch, and to a first ground node;
- a second programmable capacitor connected to the first input node and to a second circuit node for which an acceleration range selection is implemented by the first and second programmable capacitors;
- a set of capacitors in series with the second programmable capacitor, and connected to the second circuit node and through a set of switches to a set of voltage sources;
- a third programmable capacitor connected between a second ground node and the second circuit node for which a gain trimming of the interface circuit is implemented by adjusting capacitance value of the third programmable capacitor; and
- a fourth switch in parallel with the third programmable capacitor and connected between the second circuit node and the second ground node.

The proposed new solution has the advantage that the physical implementation of the gain trimming and range selection is much easier than in existing solutions because the programmability burden is divided into different capacitors contrary to the existing solutions, where these tasks are carried out by one single capacitor. More specifically, according to the present invention, the fine size gain trimming may be carried out by a grounded capacitor, which makes a precise gain trimming relatively easy. Acceleration range selection tuning with a coarse grain size may be carried out by two floating programmable capacitors.

According to a second aspect of the invention, there is provided a capacitive accelerometer comprising the interface circuit and further comprising the sensor comprising a first capacitor connected to a second voltage source, a second capacitor connected to a third voltage source, a fourth voltage source and a fifth voltage source connected to the set of switches.

According to a third aspect of the invention, there is provided a method of operating the interface circuit wherein the method comprises adjusting capacitance values of the first and second programmable capacitors to take into account acceleration range variations of the sensor, and/or adjusting a capacitance value of the third programmable capacitor to implement gain trimming of the interface circuit.

Other aspects of the invention are recited in the dependent claims attached hereto.

BRIEF DESCRIPTION OF THE DRAWINGS

Other features and advantages of the invention will become apparent from the following description of a non-limiting example embodiment, with reference to the appended drawings, in which.

DETAILED DESCRIPTION OF THE INVENTION

Figure 1B:
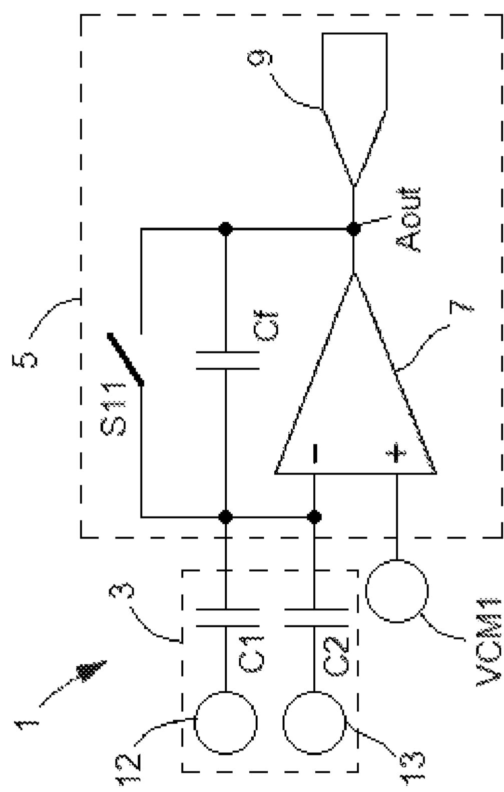
FIG. 1*b* is a simplified circuit diagram illustrating a capacitive accelerometer during the XFER phase according to one example prior art solution.

An embodiment of the present invention will now be described in detail with reference to the attached figures. The invention will be described in the context of a capacitive accelerometer comprising two capacitors. However, the disclosed capacitive accelerometer is not limited to a solution comprising two capacitors. The disclosed accelerometer may operate as a multi-axis accelerometer (e.g. axes x, y and z). Identical or corresponding functional and structural elements which appear in different drawings are assigned the same reference numerals.

Figure 3:
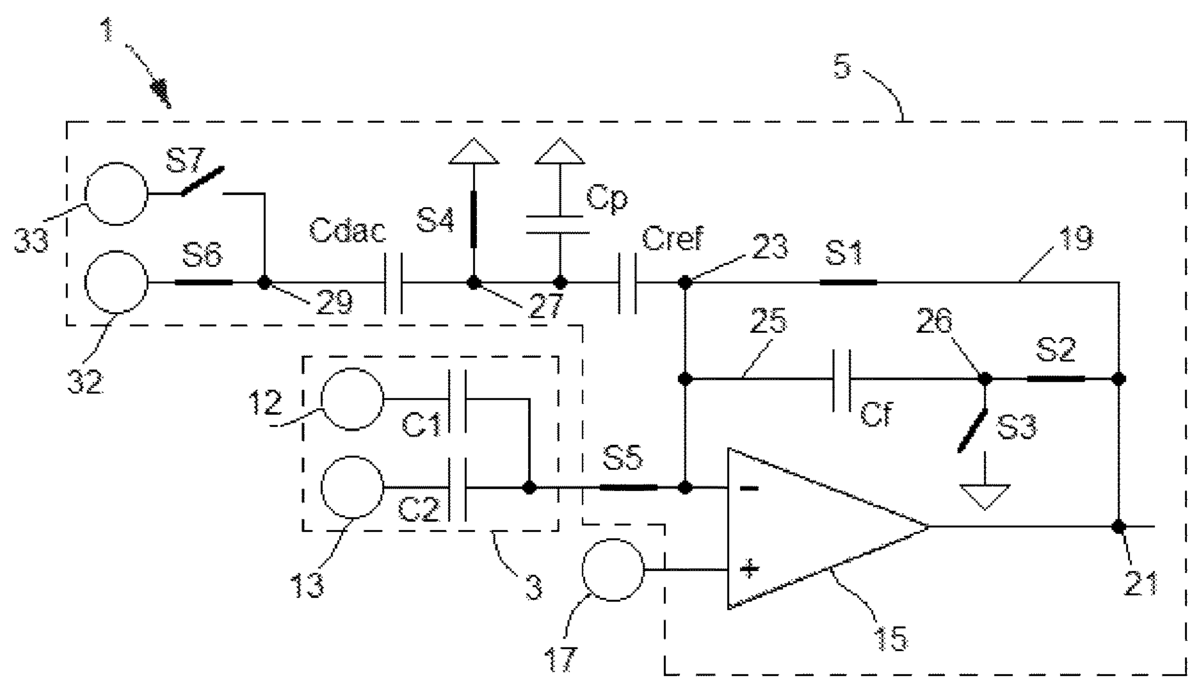
FIG. 3 is a simplified circuit diagram illustrating a capacitive accelerometer during the AZ phase according to one example of the present invention.

FIG. 3 illustrates a capacitive accelerometer system or device 1, referred to simply as a capacitive accelerometer or accelerometer, according to an example of the present invention. There is shown a micro-electro-mechanical system (MEMS), which operates as a capacitive accelerometer sensor 3. In this example, the sensor 3 comprises a first electrode, a second electrode and a third electrode. In this example, all the electrodes are plate electrodes, such as metal plates, and arranged substantially parallel to each other so that the third electrode is located between the first and second electrodes. Furthermore, according to this example, the first and second electrodes are fixed electrodes, i.e. they are stationary, while the third electrode is a mobile electrode, i.e. it is arranged to be displaced if the sensor is subject to an acceleration. If the sensor 3 is not subject to any acceleration, the mobile electrode is centrally located between the first and second electrodes. The first and third electrodes together form the first sensing capacitor C1 with first capacitance $c_1$, while the second and third electrodes together form the second sensing capacitor C2 with second capacitance $c_2$.

The second voltage source 12 is connected to the first capacitor C1, while the third voltage source 13 is connected the second capacitor C2. The voltage sources can have the output of supply voltage VDD or VSS and/or otherwise adjusted. The accelerometer sensor 3 uses "force=mass× acceleration" property to transfer acceleration to force, and then the force is transferred to a mobile electrode displacement x through the spring stiffness of a spring connected to the mobile electrode.

The mobile electrode displacement x generates a capacitance difference between the first capacitance $c_1$ and the second capacitance $c_2$, referred to as differential capacitance. The differential capacitance is transformed to electrical charges by an interface electronic circuit or circuitry 5, which is an integrated circuit (IC) connected to the sensor 3. For this purpose, the accelerometer may comprise switching means (not illustrated) for applying voltage, by using the second and third voltage sources 12, 13, across the first and second capacitors C1, C2. The resulting charges are collected and measured by the interface circuit 5. The number of charges is proportional to the differential capacitance and to the voltage applied across the first and second capacitors C1, C2.

The interface circuit 5 comprises an amplifier 15, which has two inputs, namely a first, negative input node 23 and a second, positive input node. The positive input is connected to a first voltage source 17, which supplies the common mode voltage $V_{cm}$. The negative input in this example is connected to the mobile electrode. A first feedback circuit 19 or branch is arranged between an output node 21 of the amplifier 15 and the negative input node 23. The first feedback circuit 19 comprises a first switch S1. A capacitance between the negative input node 23 and the output node 21 is the feedback capacitance $c_f$ of a third capacitor, referred to as the feedback capacitor Cf or a first programmable capacitor. The feedback capacitance Cf is part of a second feedback circuit 25 or branch. The second feedback circuit also comprises a second switch S2 between the feedback capacitor Cf and the output node 21 in series with the feedback capacitor Cf. A third switch S3 is connected to the second feedback circuit 25 such that a first side or end of the third switch S3 is connected to first circuit node 26 between the feedback capacitor Cf and the second switch S2, while a second side or end of the third switch S3 is connected to ground. The third switch S3 may also be considered as part of the second feedback circuit 25.

A fourth capacitor Cref, referred to also as a second programmable capacitor, is connected between the negative input node 23 and a second circuit node 27. A fifth capacitor Cp, referred to also as a third programmable capacitor, is also connected to this circuit node such that a first side or electrode of the fifth capacitor Cp is connected to the second circuit node 27, while a second side or electrode of the fourth capacitor Cp is grounded. A fourth switch S4 is provided parallel to the third programmable capacitor Cp such that a first end of the switch is connected to the second circuit node 27, while a second end of the fourth switch S4 is grounded. A set of capacitors Cdac (which in this example are not programmable) or a capacitor array is also connected to the second circuit node 27 to be in series with the second programmable capacitor Cref. While first electrodes of the set of capacitors Cdac are connected to the second circuit node 27, second electrodes of the set of capacitors Cdac are connected to a third circuit node 29.

A first set of switches S6 is connected between the third circuit node 29 and a fourth voltage source 32, which in this example is set to 0 V. A second set of switches S7 is parallel to the first set of switches S6 and connected between the third circuit node 29 and a fifth voltage source 33, which in this example is arranged to supply the positive supply voltage VDD. The first and second set of switches S6, S7 each comprise a plurality of switches in parallel.

Figure 1A:
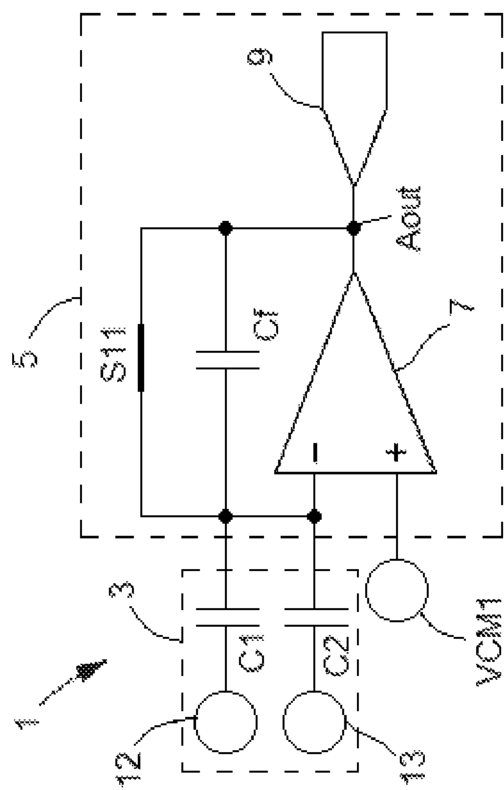
FIG. 1*a* is a simplified circuit diagram illustrating a capacitive accelerometer during the AZ phase according to one example prior art solution.
Figure 2:
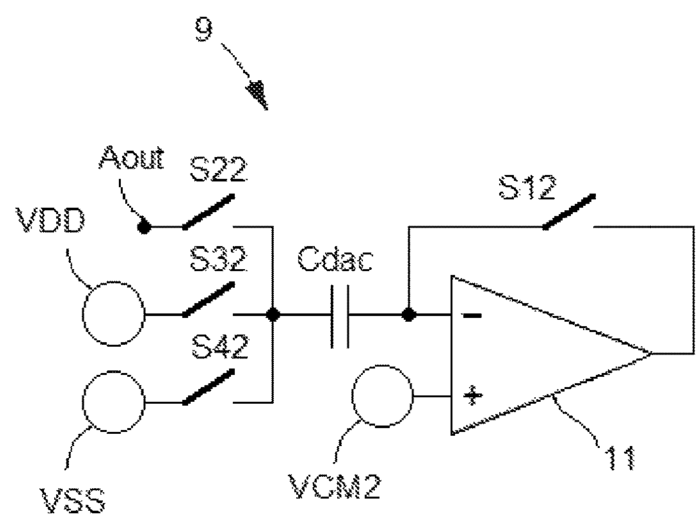
FIG. 2 is a simplified circuit diagram illustrating an example ADC circuit during the SAR convergence phase in the capacitive accelerometer of FIGS. 1*a* and 1 *b;*

The proposed analogue front-end interface circuit 5 is partly derived by combining the charge acquisition circuit or interface circuit 5 of FIG. 1*a* and the SAR ADC circuit of FIG. 2. The first and second capacitors C1, C2 and the feedback capacitor Cf in FIG. 3 have the same roles as those in FIG. 1*a*. The set of capacitors Cdac in FIG. 3 may be the traditional capacitor array of the SAR ADC in FIG. 2 based on charge redistribution method. The second programmable capacitor Cref is inserted between the set of capacitors Cdac and the amplifier 15. According to the present invention, the third programmable grounded capacitor Cp is used to trim the gain of the proposed analogue front-end, while the first programmable capacitor, i.e. the feedback capacitor Cf, and the second programmable capacitor Cref are programmable to accommodate different input ranges of the accelerations: 2 g, 4 g, 8 g and 16 g, for instance. The operation of the proposed analogue front-end circuit 5 can be divided into three phases: an auto-zero (AZ) phase, a charge transfer (XFER) phase and an SAR convergence phase.

FIG. 3 illustrates the circuit configuration during the AZ phase. In this configuration the first, second, fourth and fifth switches S1, S2, S4, S5 and the first set of switches S6 are closed, while the third switch S3 and the second set of switches S7 are open. In the present description, an electrical switch is said to be closed when it is conductive, i.e. restores a conductive path, and it is said to be open when it is not conductive, i.e. removes a conductive path. Furthermore, the second voltage source 12 is set to 0 V, while the third voltage source 13 is now set to the positive supply voltage VDD. It is to be noted that in all the three configurations shown in FIGS. 3 to 5, the fourth voltage source is set to 0 V, while the fifth voltage source supplies the positive supply voltage VDD. During the AZ phase, the charges in the first, second and third programmable capacitors Cf, Cref, Cp and in the set of capacitors Cdac are set or reset to an initial state.

Figure 4:
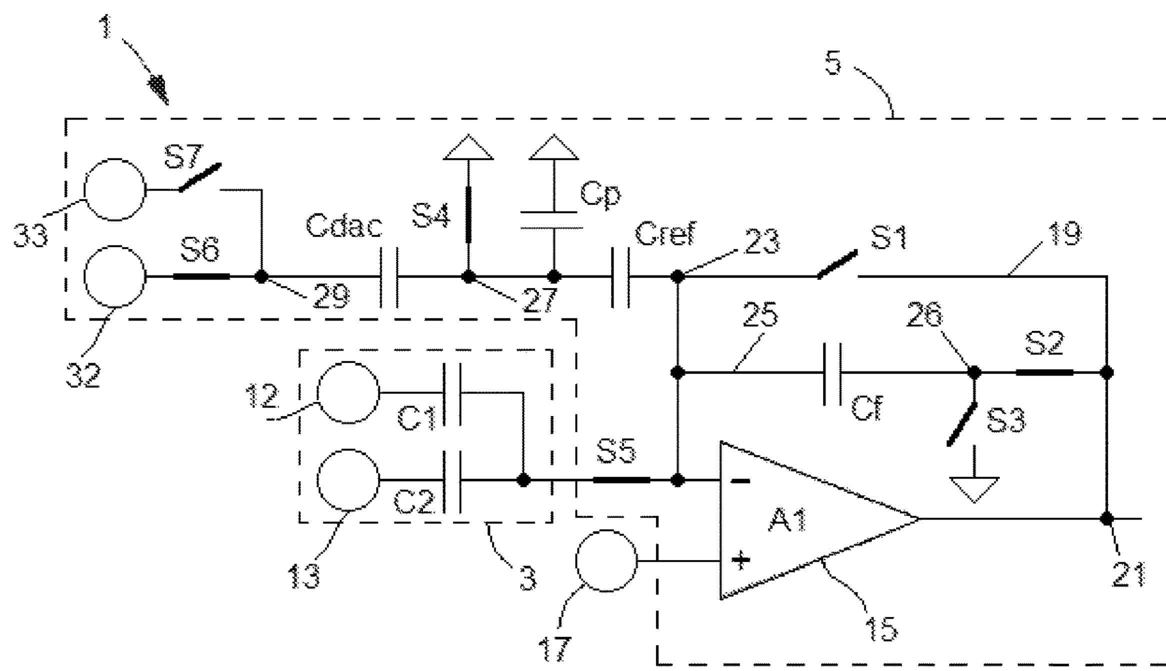
FIG. 4 is the capacitive accelerometer of FIG. 3 but during the XFER phase.

FIG. 4 illustrates the circuit configuration during the XFER phase. The second, fourth and fifth switches S2, S4, S5 and the first set of switches S6 are closed, while the first and third switches of S1, S3 and the second set of switches S7 are open. The second voltage source 12 now supplies the positive supply voltage VDD, while the third voltage source 13 is now set to 0 V. In other words, the first capacitor C1 is now connected to the positive supply voltage VDD, while the second capacitor C2 is connected to 0 V. With this configuration, some charges are injected into the first programmable capacitor Cf. The output voltage $V_{out}$ measured at the amplifier output node 21 can be calculated as follows $$V_{out}=VDD\cdot(c_1-c_2)/c_f$$

Figure 5:
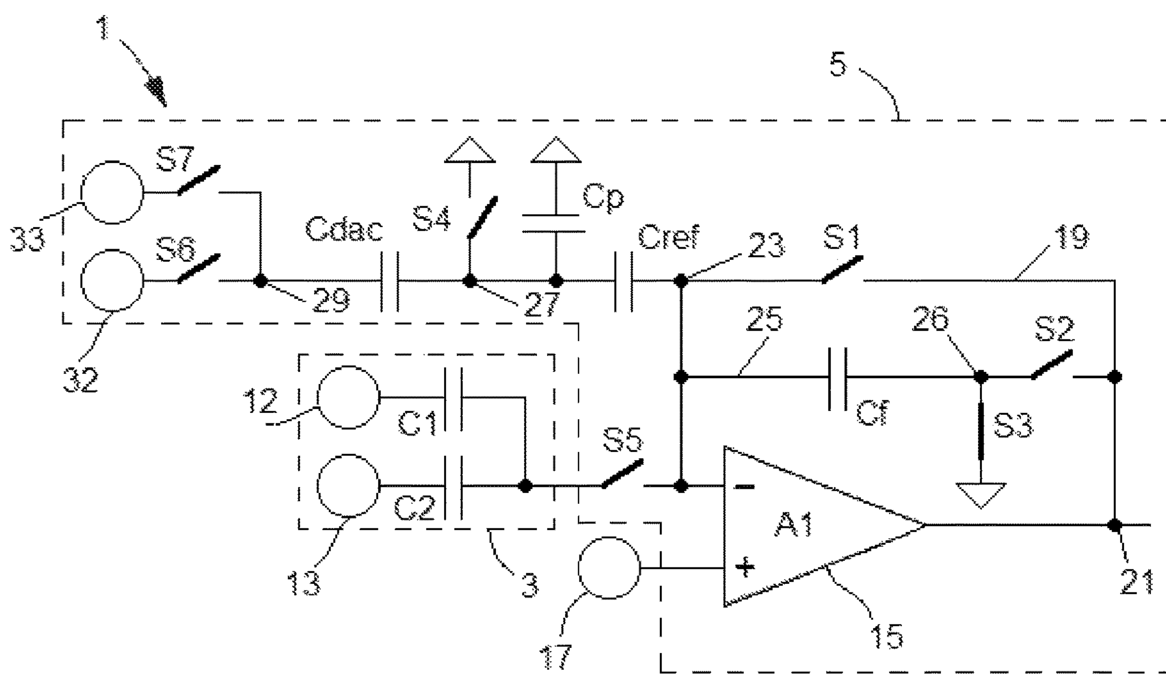
FIG. 5 is the capacitive accelerometer of FIG. 3 but during the SAR convergence phase.

FIG. 5 illustrates the circuit configuration during the SAR convergence phase. The third switch S3 is closed, while the first, second, fourth and fifth switches of S1, S2, S4 and S5 are open. Contrary to the AZ and XFER phases, in this configuration the amplifier 15 operates as a comparator to compare the voltage values at the positive and negative input nodes. The first and second set of switches S6 and S7 are controlled by the SAR algorithm, i.e. the binary searching algorithm. The amplifier input capacitance or the sensed acceleration value is digitised as follows $$D_{out}=((c_1-c_2)/c_{ref})\cdot(c_{dac}/(c_{dac}+c_{ref}+c_p)),$$

where, $D_{out}$ is a quantized fractional value. The gain of the analogue front-end interface circuit 5 can be calculated as follows $$\text{Gain}=D_{out}/(c_1-c_2)=(1/c_{ref})\cdot(c_{dac}/(c_{dac}+c_{ref}+c_p)),$$

where $c_{ref}$ is the capacitance of the second programmable capacitor Cref, $c_{dac}$ is the capacitance of the set of capacitors Cdac and $c_p$ is the capacitance of the third programmable capacitor Cp.

In the proposed interface circuit 5, the acceleration range selection, for instance between 2 g, 4 g, 8 g and 16 g, can be implemented by the first and second programmable capacitors Cf, Cref with coarse increments. This is feasible even if the capacitance values of these two capacitors are small in the 2 g range. It is to be noted that the first and second programmable capacitors Cf and Cref have the same capacitance values $c_f$, $c_{ref}$ in this example. Thus, the second programmable capacitor Cref can be considered as a duplicate of the first programmable capacitor Cf, or vice versa. The analogue gain trimming can be implemented by the third programmable Cp with fine grain size or with small increments. This is feasible since the third programmable capacitor of Cp is grounded. It is to be noted that it is much easier to program with good precision grounded capacitors than floating capacitors. Thus, it is much less challenging to implement a precise programming with a small step size of the third programmable capacitor Cp than the floating capacitor Cf in the configuration of FIG. 1*a* for example.

To summarise, the present invention relates to an interface circuit 5 for a capacitive accelerometer sensor 3 for measuring an acceleration value sensed by the sensor 3. The interface circuit 5 comprises a plurality of electrical switches S1-S7 and three programmable capacitors Cf, Cref, Cp. Two of the programmable capacitors Cf, Cref are arranged to implement acceleration range selection, while one of the programmable capacitors Cp is arranged to implement gain trimming of the interface circuit 5. In the drawings, the first, fourth and fifth voltage sources 17, 32, 33 are shown as being outside of the interface circuit 5 but according to a variant of the present invention they are part of the interface circuit 5.

While the invention has been illustrated and described in detail in the drawings and foregoing description, such illustration and description are to be considered illustrative or exemplary and not restrictive, the invention being not limited to the disclosed embodiment. Other embodiments and variants are understood, and can be achieved by those skilled in the art when carrying out the claimed invention, based on a study of the drawings, the disclosure and the appended claims.

In the claims, the word "comprising" does not exclude other elements or steps, and the indefinite article "a" or "an" does not exclude a plurality. The mere fact that different features are recited in mutually different dependent claims does not indicate that a combination of these features cannot be advantageously used. Any reference signs in the claims should not be construed as limiting the scope of the invention.

What is claimed is:

1. An interface circuit for a capacitive accelerometer sensor for measuring an acceleration value sensed by the sensor, the interface circuit comprising:

an amplifier comprising a first input node connected to the sensor, a second input node connected to a first voltage source, and an output node;

a first amplifier feedback circuit comprising a first switch between the first input node and the output node;

a second amplifier feedback circuit between the first input node and the output node, and comprising a first programmable capacitor and a second switch in series with the first programmable capacitor, and a third switch connected to a first circuit node between the first programmable capacitor and the second switch, and to a first ground node;

a second programmable capacitor connected to the first input node and to a second circuit node for which an acceleration range selection is implemented by the first and second programmable capacitors;

a set of capacitors in series with the second programmable capacitor, and connected to the second circuit node and through a set of switches to a set of voltage sources;

a third programmable capacitor connected between a second ground node and the second circuit node for which a gain trimming of the interface circuit is implemented by adjusting capacitance value of the third programmable capacitor; and a fourth switch in parallel with the third programmable capacitor and connected between the second circuit node and the second ground node.

2. The interface circuit according to claim 1, wherein the interface circuit further comprises a fifth switch between the first input node and the sensor.

3. The interface circuit according to claim 2, wherein the set of switches comprises a sixth switch and a seventh switch in parallel with the sixth switch.

4. The interface circuit according to claim 3, wherein the sixth switch comprises a first switch circuit, and the seventh switch comprises a second switch circuit.

5. The interface circuit according to claim 1, wherein the capacitance values of the first and second programmable capacitors are substantially the same.

6. The interface circuit according to claim 1, wherein the amplifier is arranged to operate as a comparator when the first and second switches are open.

7. The interface circuit according to claim 1, wherein the second switch is connected between the output node and the first circuit node.

8. The interface circuit according to claim 1, wherein the first input node is a negative input node of the amplifier, whereas the second input node is a positive input node of the amplifier.

9. A capacitive accelerometer comprising the interface circuit according to claim 1, and further comprising the sensor comprising a first capacitor connected to a second voltage source, a second capacitor connected to a third voltage source, a fourth voltage source and a fifth voltage source connected to the set of switches.

10. The capacitive accelerometer according to claim 9, wherein the second and third voltage sources are programmable voltage sources.

11. A method of operating the interface circuit according to claim 1, wherein the method comprises adjusting capacitance values of the first and second programmable capacitors to take into account acceleration range variations of the sensor, and/or adjusting a capacitance value of the third programmable capacitor to implement gain trimming of the interface circuit.

12. The method according to claim 11, wherein the method further comprises initialising the first, second and third programmable capacitors and the set of capacitors during a first operational phase, wherein during the first operational phase the first, second and fourth switches are closed, whereas the third switch is open.

13. The method according to claim 11, wherein the method further comprises injecting electrical charges into the first programmable capacitor from the sensor during a second operational phase, wherein during the second operational phase the first and third switches are open, whereas the second and fourth switches are closed.

14. The method according to claim 11, wherein the sensor comprises a first capacitor connected to a second voltage source, a second capacitor connected to a third voltage source, and wherein the method comprises inverting the voltage values of the second and third voltage sources during the second operational phase.

15. The method according to claim 11, wherein the method further comprises disconnecting the sensor from the interface circuit by opening a fifth switch between the sensor and the interface circuit, and converting an input capacitance of the amplifier into a digital value during a third operational phase, wherein during the third operational phase the first, second and fourth switches are open, whereas the third switch is closed.

* * * * *

UNITED STATES PATENT AND TRADEMARK OFFICE

CERTIFICATE OF CORRECTION

PATENT NO. : 10,725,066 B2
APPLICATION NO. : 16/001107
DATED : July 28, 2020
INVENTOR(S) : Yonghong Tao et al.

It is certified that error appears in the above-identified patent and that said Letters Patent is hereby corrected as shown below:

On the Title Page

In Column 1, item (73), Assignee, Lines 1-2, delete "EM Microeletronic-Marin SA, Marin (CH)" and insert --EM Microelectronic-Marin SA, Marin (CH)--.

Signed and Sealed this
Sixteenth Day of February, 2021

Drew Hirshfeld
*Performing the Functions and Duties of the*
*Under Secretary of Commerce for Intellectual Property and*
*Director of the United States Patent and Trademark Office*